United States Patent [19]

Ema

[11] Patent Number: 4,910,566
[45] Date of Patent: Mar. 20, 1990

[54] LAYER STRUCTURE OF A MEMORY CELL FOR A DYNAMIC RANDOM ACCESS MEMORY DEVICE AND METHOD FOR PRODUCING THE SAME

[75] Inventor: Taiji Ema, Kawasaki, Japan

[73] Assignee: Fujitsu Limited, Kawasaki, Japan

[21] Appl. No.: 269,690

[22] Filed: Nov. 10, 1988

[30] Foreign Application Priority Data

Nov. 17, 1987 [JP] Japan .................. 62-288510

[51] Int. Cl.[4] .......................................... H01L 27/10
[52] U.S. Cl. ..................... 357/23.6; 357/59; 357/71; 357/51
[58] Field of Search ............... 357/23.6, 59 G, 59 K, 357/71, 51

[56] References Cited

U.S. PATENT DOCUMENTS 4,649,406  3/1987  Takemae .................. 357/23.6
4,812,885  3/1989  Riemenschneider ........... 357/23.5

FOREIGN PATENT DOCUMENTS 48062 of 1987 Japan .

Primary Examiner—Andrew J. James
Assistant Examiner—David Soltz
Attorney, Agent, or Firm—Staas & Halsey

[57] ABSTRACT

A layer structure of a memory cell for a dynamic random access memory device includes a semiconductor substrate, an insulation film formed on the semiconductor substrate having a first window through which a surface of the semiconductor substrate is partially exposed, a first conductive film formed on the insulation film so as to surround the contact window and form a second window above the first window, a second conductive film formed so as to be in contact with the first conductive film, and the semiconductor substrate through the first and second windows, the first and second conductive films constructing a storage electrode of a memory cell capacitor, a dielectric film formed so as to cover the storage electrode; and a third conductive film formed so as to cover the dielectric film.

12 Claims, 13 Drawing Sheets

LAYER STRUCTURE OF A MEMORY CELL FOR A DYNAMIC RANDOM ACCESS MEMORY DEVICE AND METHOD FOR PRODUCING THE SAME

BACKGROUND OF THE INVENTION

The present invention generally relates to a dynamic random access memory device, and more particularly to improvements in a layer structure of a memory cell for a random access memory device.

As is well known, a memory cell used in a dynamic random access memory device (hereinafter simply referred to as a DRAM device) is composed of a memory cell capacitor (or a stacked capacitor) and a transfer transistor. In order to reduce the size of a DRAM device, it is necessary to reduce length and width of the memory cell, or an area of the memory cell which occupies a semiconductor substrate. In a case where an area defined by length and width of the memory cell is equal to or less than 10 $[\mu m^2]$, it becomes impossible to obtain a memory cell capacitor having sufficient capacitance.

In order to increase capacitance of the memory capacitor without increasing the area which occupies the semiconductor substrate, an improved structure of the memory cell capacitor has been proposed in the Japanese Laid-Open Patent Application No. 62-48062. The disclosed improved structure has a memory cell capacitor in which a storage capacitor consists of a plate-shaped film and a vertical projection film, which are made of polysilicon. The plate-shaped film and vertical projection film are formed on an interlayer insulation film. The vertical projection film is in contact with a side wall of the plate-shaped film, and projects over an upper surface of the plate-shaped film. With the vertical projection film, it is possible to increase the capacitance of the memory cell capacitor.

However, the disclosed improvement has disadvantages described below. As described in the above document, the vertical projection film is formed by etching a polysilicon film deposited so as to cover a patterned silicon dioxide film which is formed on the plate-shaped film formed on the interlayer insulation film. In the etching, an upper portion of the deposited polysilicon film in the vicinity of a top surface of the patterned silicon dioxide film is liable to be greatly etched (over-etching), compared with a lower portion of the deposited polysilicon film. As a result, it is very difficult to obtain a predetermined height of the vertical film. Therefore, values of capacitance of memory cell capacitors are not identical to each other.

Normally, the interlayer insulation film on which the plate-shaped and vertical projection films are formed, has recess and convex surface portions due to the presence of gate electrodes. Therefore, it is very difficult to form the vertical projection film on the recess and convex surface portions of the interlayer insulation film with high controllability.

The aforementioned patterned silicon dioxide film is removed by isotropic etching in which a gas of HF is used. As a result, the interlayer insulation film on which the plate-shaped and vertical projection films are formed, must be made of silicon nitride ($Si_3H_4$).

SUMMARY OF THE INVENTION

It is therefore a general object of the present invention to provide a novel and useful a layer structure of a memory cell for a dynamic random access memory device and a method for producing the same in which the aforementioned disadvantages are eliminated.

A more specific object of the present invention is to provide a layer structure of a memory cell for a dynamic random access memory device in which each memory cell has an increased value of capacitance and the same electrical characteristic.

The above objects of the present invention can be achieved by a memory cell layer structure including a semiconductor substrate; an insulation film formed on the semiconductor substrate having a first window through which a surface of the semiconductor substrate is partially exposed; a first conductive film formed on the insulation film so as to surround the contact window and form a second window above the first window; a second conductive film formed so as to be in contact with the first conductive film, and the semiconductor substrate through the first and second windows, the first and second conductive films constructing a storage electrode of a memory cell capacitor; a dielectric film formed so as to cover the storage electrode; and a third conductive film formed so as to cover the dielectric film.

Still another object of the present invention is to provide a method of producing the layer structure of the memory cell for the dynamic random access memory device with which it becomes possible to easily produce memory cells each having an increased value of capacitance and the same electrical characteristic.

The above another object of the present invention can be achieved by a method of producing the memory cell layer structure of the dynamic random access memory device including the steps of forming an insulation film on a semiconductor substrate; forming a first conductive film on the insulation film, the first conductive film being used for forming a part of a storage electrode of a memory cell capacitor; patterning the first conductive film and the insulation film so as to form a window used for forming a contact between the storage electrode and the semiconductor substrate; forming a second conductive film so as to cover the window and the first conductive film, the second conductive film being used for forming the remaining part of the storage electrode; and patterning the first conductive film and the second conductive film, patterned first and second conductive films constructing the storage electrode; forming a dielectric film so as to cover the storage electrode; and forming a third conductive film so as to cover the dielectric film, the third conductive film being an opposed electrode which is paired with the storage electrode of the memory cell capacitor.

Other objects, features and advantages of the present invention will become apparent from the following detailed description when read in conjunction with the accompanying drawings.

DETAILED DESCRIPTION

Figure 1:
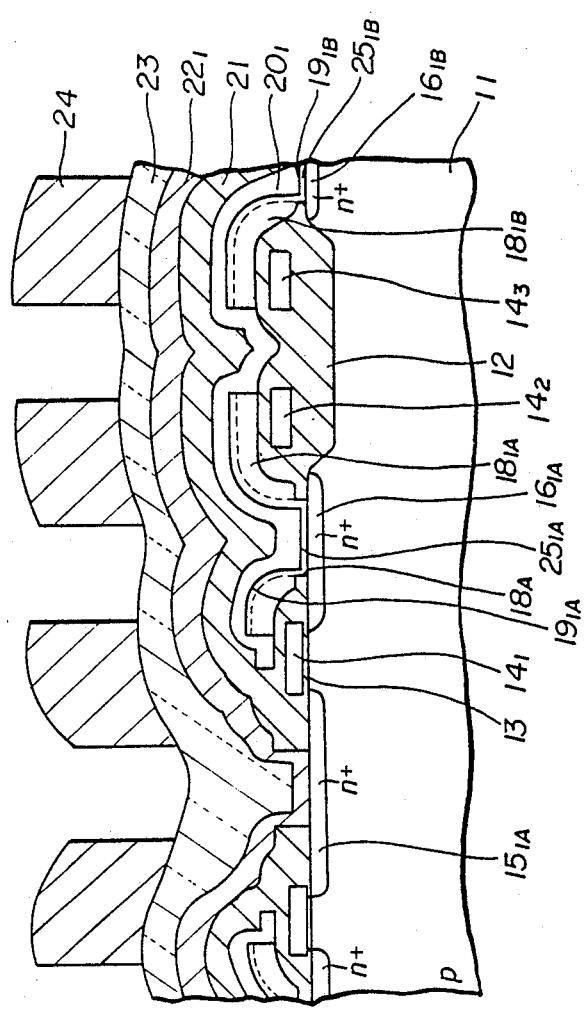
FIG. 1 is a cross sectional view of a preferred embodiment of the present invention.

A description is given of the first embodiment of the present invention with reference to FIG. 1.

Referring to FIG. 1, the DRAM device of the first embodiment comprises a p-type silicon semiconductor substrate 11, a field insulation film 12, a gate insulation film 13, gate electrodes $14_1$, $14_2$ and $14_3$ of polysilicon, an n+-type source region $15_{1A}$, an n+-type drain region $16_{1A}$, and an interlayer insulation film 17 of silicon dioxide. An essential feature of the present embodiment is the layer structure of a storage electrode. The storage electrode consists of a first patterned conductive film $18_{1A}$ and a second patterned conductive film $25_{1A}$. The second patterned conductive film $25_{1A}$ is in contact with the n+-type drain region $16_{1A}$. The second patterned conductive film $25_{1A}$ is formed so as to overlie the first patterned conductive film $18_{1A}$. The first and second patterned conductive films $18_{1A}$ and $25_{1A}$ are made of a polysilicon film which is doped with n+-type impurity ions such as arsenic ions (As+). A dielectric film $19_{1A}$ is formed so as to surround the storage electrode. An opposed electrode $20_1$ is formed so as to cover the dielectric film $19_{1A}$. An interlayer insulation film 21 is formed so as to cover the opposed electrode $20_1$. A bit line $22_1$ is formed so as to overlie the interlayer insulation film 21 and make contact with the n+-type source region $15_{1A}$. The bit line $22_1$ is coated with a passivation film 23. A plurality of word lines 24 are formed on the passivation film 23.

Figure 2:
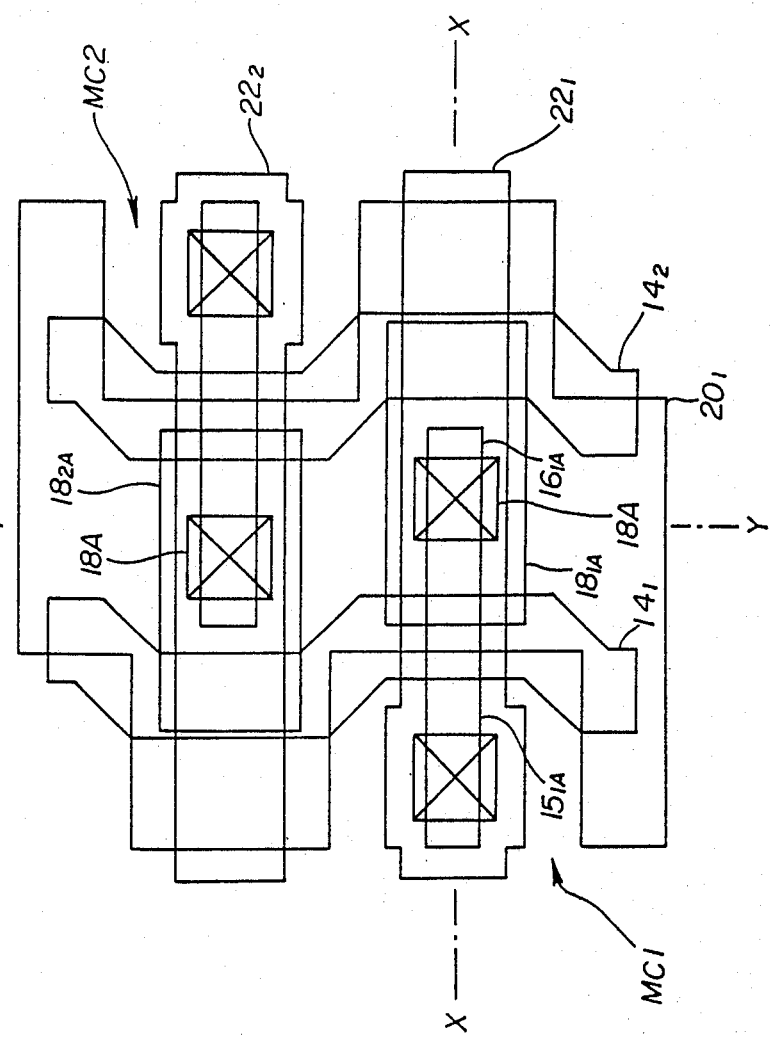
FIG. 2 is a plan view of an essential portion of a DRAM device having a layer structure of a memory cell provided by the preferred embodiment of FIG. 1.

A description is given of a method for producing the memory cell of FIG. 1 with reference to FIGS. 2 through 15. FIG. 2 is a plan view of memory cells MC1 and MC2 formed in the DRAM device having the memory cell layer structure of FIG. 1. FIGS. 3 through 15 are cross sectional views observed at respective essential manufacturing steps. FIGS. 3 through 8 and FIG. 15 are cross sectional views each taken along the line X—X shown in FIG. 2. FIGS. 9 through 14 are cross sectional views each taken along the line Y—Y shown in FIG. 2. In these figures, those parts which are the same are given the same reference numerals. It is noted that illustrated portions in some figures do not perfectly correspond to illustrated portions in other figures.

Figure 3:
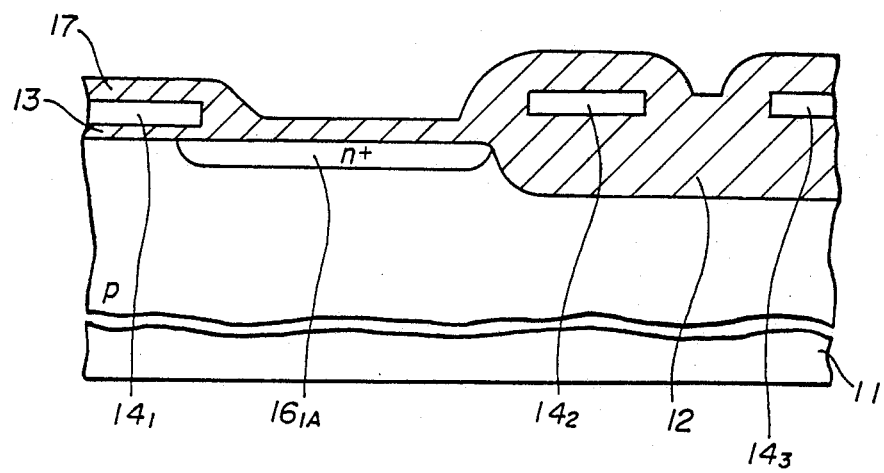
FIGS. 3 through 8 are cross sectional views taken along the line I—I shown in FIG. 1 at different production steps of the preferred embodiment of the present invention.
Figure 9:
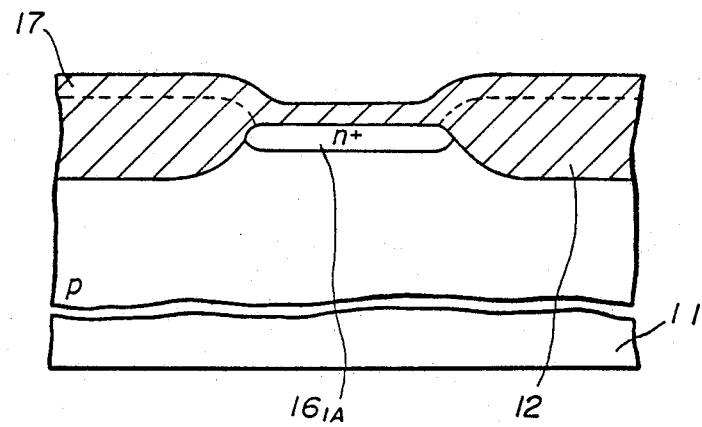
FIGS. 9 though 14 are cross sectional views taken along the line II—II shown in FIG. 1 at different production steps of the preferred embodiment of the present invention.

Referring to FIGS. 3 and 9, by conventional production steps, on the p-type silicon semiconductor substrate 11, formed are the field insulation film 12, the gate insulation film 13, the gate electrodes $14_1$, $14_2$ and $14_3$ of polysilicon, the n+-type source region $15_{1A}$, the n+-type drain region $16_{1A}$, and the interlayer insulation film 17 of silicon dioxide. The gate electrode $14_1$ is provided with respect to the memory cell MC1, and the gate electrode $14_2$ is provided with respect to the memory cell MC2. A memory cell with respect to the gate electrode $14_3$ is not shown.

Figure 4:
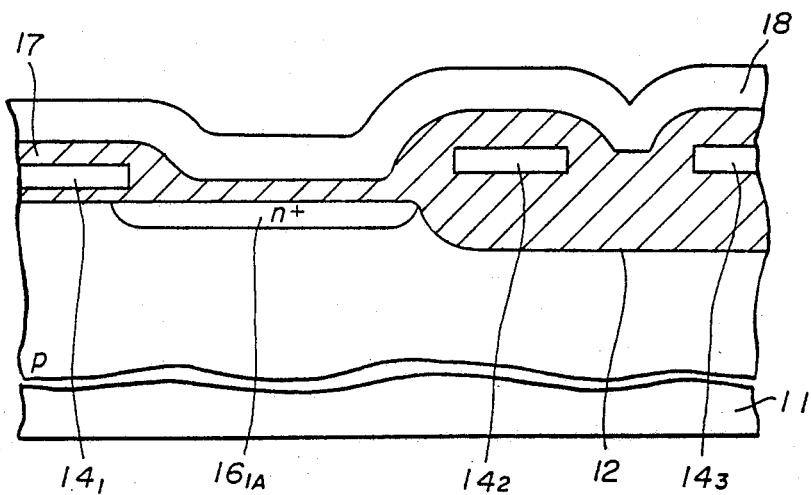
Figure 10:
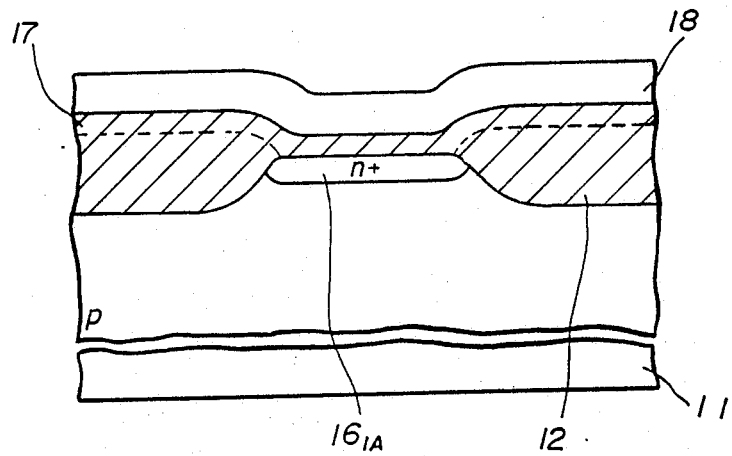

Referring to FIGS. 4 and 10, a polysilicon film 18 is deposited to a thickness of approximately 0.2 [μm] by chemical vapor deposition (CVD). The polysilicon film 18 is used for forming first patterned conductive films $18_{1A}$ and $18_{1B}$. Each of the first conductive films $18_{1A}$ and $18_{1B}$ is a part of each of the corresponding storage electrodes.

Figure 5:
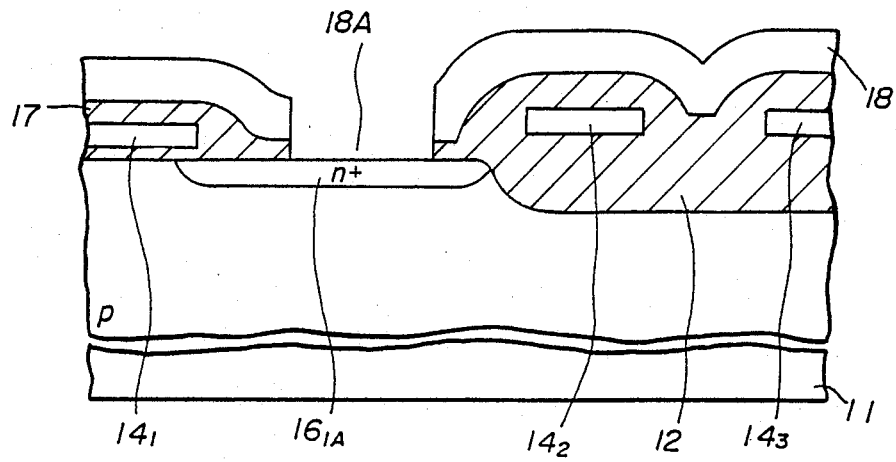
Figure 11:
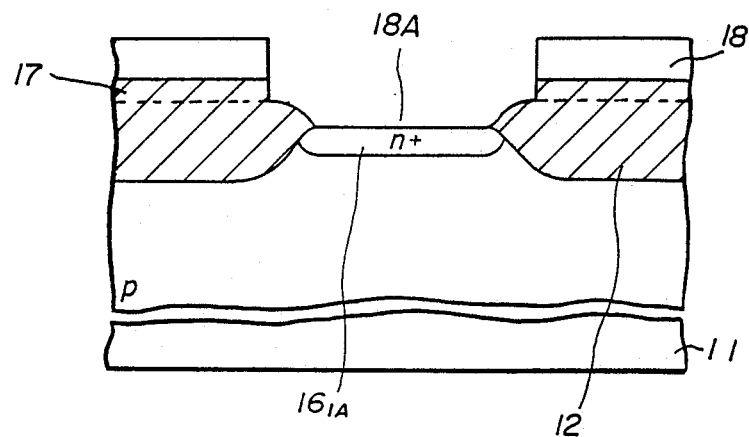

Referring to FIGS. 5 and 11, after depositing a mask film on the entire surface of the silicon substrate 11, the polysilicon film 18 is selectively etched by the conventional photolithography technology (anisotropic etching based on reactive ion etching: RIE) so as to form a contact window 18A with respect to the storage electrode of the memory cell capacitor. Subsequently, by using the same mask film, the interlayer insulation film 17 and the gate insulation film 13 are subjected to selective etching (RIE) so that a surface portion of the drain region $16_{1A}$ becomes exposed. It is noted that as shown in FIG. 10, edges of the exposed surface of the drain region $16_{1A}$ which extend in the X direction shown in FIG. 2, are defined by edges of the field insulation film 12 which extend in the X direction. A length of each edge of the exposed surface of the drain region $16_{1A}$ in the Y direction can be made smaller than the width of the contact window 18A in the X direction. Therefore, a bit line pitch which is defined as a distance between the centers of adjacent bit lines $22_1$ and $22_2$ arranged in the Y direction as shown in FIG. 1, is made smaller than a word line pitch which is defined as a distance between the centers of adjacent word lines $14_1$ and $14_2$ arranged in the X direction. Therefore, it becomes possible to efficiently arrange sense amplifiers arranged in the Y direction with the bit line pitch.

Figure 6:
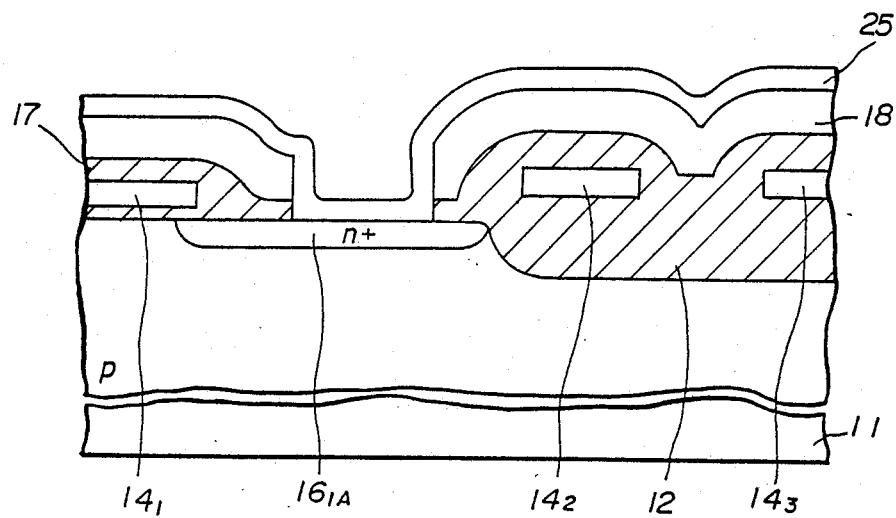
Figure 12:
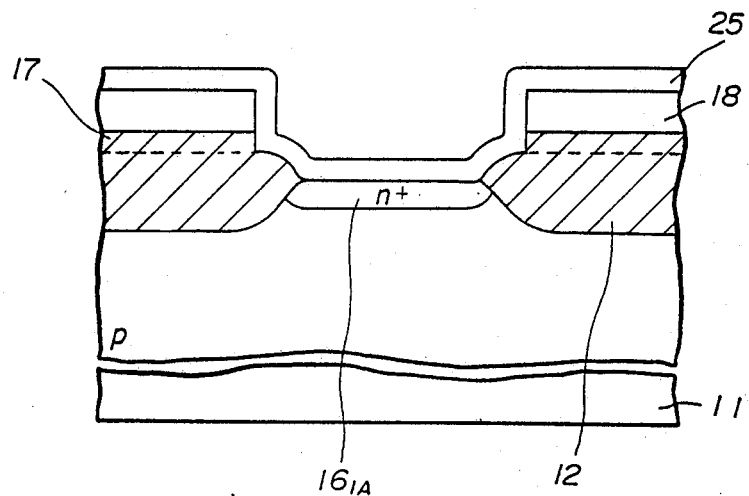

Thereafter, as shown in FIGS. 6 and 12, a polysilicon film 25 is grown to a thickness of 0.1 [μm] by chemical vapor deposition. Subsequently, n+-type impurity ions such as phosphorus (P) ions are implanted into the polysilicon film 25. Thereby, the polysilicon film 25 is changed to an n+-type conductive polysilicon film. The polysilicon film 25 thus formed is used for forming second patterned conductive films $25_{1A}$ and $25_{1B}$. Each of the second conductive films $25_{1A}$ and $25_{1B}$ is the remaining part of each of the corresponding storage electrodes. The polysilicon film 25 is in contact with the drain region $16_{1A}$. Further, the polysilicon film 25 is in contact with an upper surface of the polysilicon film 18, and an inner surface thereof, which faces the contact window 18A.

Figure 7:
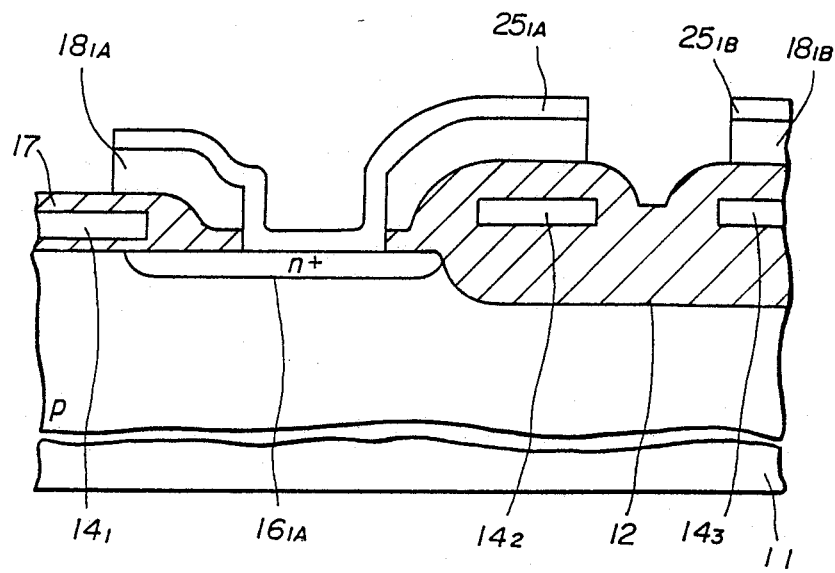
Figure 13:
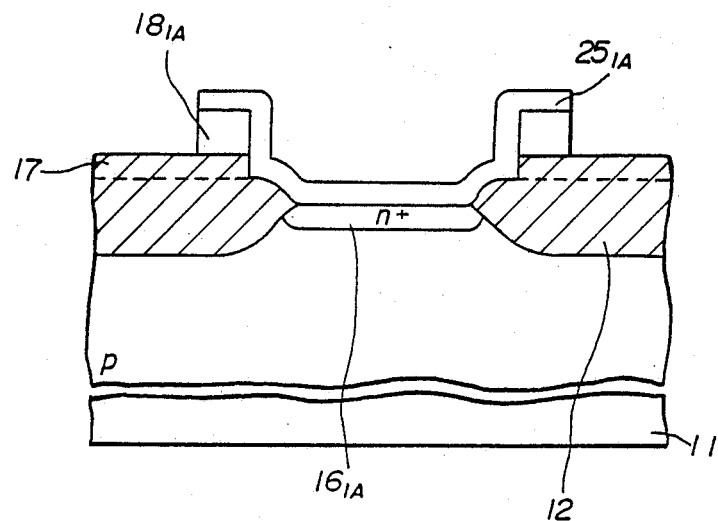

Then, the polysilicon film 25 and the polysilicon film 18 of FIGS. 6 and 12 are subjected to a patterning process based on the conventional photolithography technology. Thereby, as shown in FIGS. 7 and 13, there are formed the first patterned conductive films $18_{1A}$ and $18_{1B}$, and the second patterned conductive films $25_{1A}$ and $25_{1B}$. The first and second patterned conductive films $18_{1A}$ and $25_{1A}$ construct the storage electrode in the memory cell MC1 shown in FIG. 2.

It is noted that the storage electrode composed of the first and second patterned conductive films $18_{1A}$ and $25_{1A}$ has a curved upper surface and high side walls and high inner walls. Therefore, an increased value of capacitance of the memory cell capacitor is obtainable. For example, in a case where the memory cell area is equal to 7 [μm²], when the thickness of the storage electrode consisting of the first and second patterned conductive films $18_{1A}$ and $25_{1A}$ is set equal to 0.5 [μm], the plane area of the memory cell capacitor becomes approximately equal to the side area thereof. Therefore, an reduced plane area of the memory cell capacitor can be compensated by an increased side area thereof. It is further possible to obtain a 20% increase in the total surface area of the memory cell capacitor by the present embodiment.

Further, the film thickness or height of the second conductive film $25_{1A}$ can be easily controlled by the CVD process. Additionally, the first and second conductive films $18_A$ and $25_{1A}$ are constituted by plate-shaped films. Therefore, memory cell capacitors each having the second conductive film $25_{1A}$ of the same thickness can be formed with high controllability. It is noted that with the aforementioned conventional manufacturing process, it is very dificult to form a uniform height of the side wall film of the aforementioned memory cell capacitor, because the upper portion of the side wall film is over-etched.

Moreover, the interlayer insulation film 17 is not limited to a silicon nitride film, but can be made of silicon dioxide.

It is preferable to form the first patterned conductive film $18_{1A}$ thicker than that of the second patterned conductive film $25_{1A}$. This is because a recessed portion 30 shown in FIG. 8 can be made greater, and thereby an further increased surface area of the memory cell capacitor is obtainable.

Figure 8:
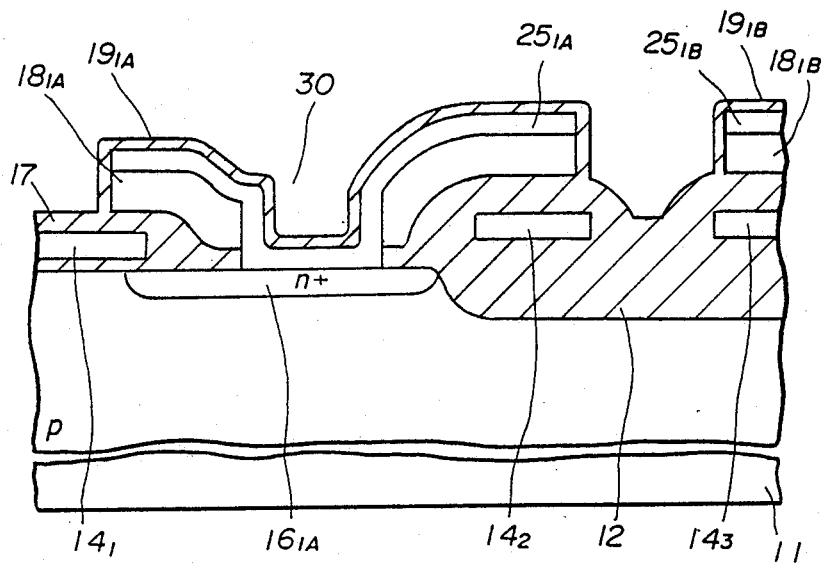
Figure 14:
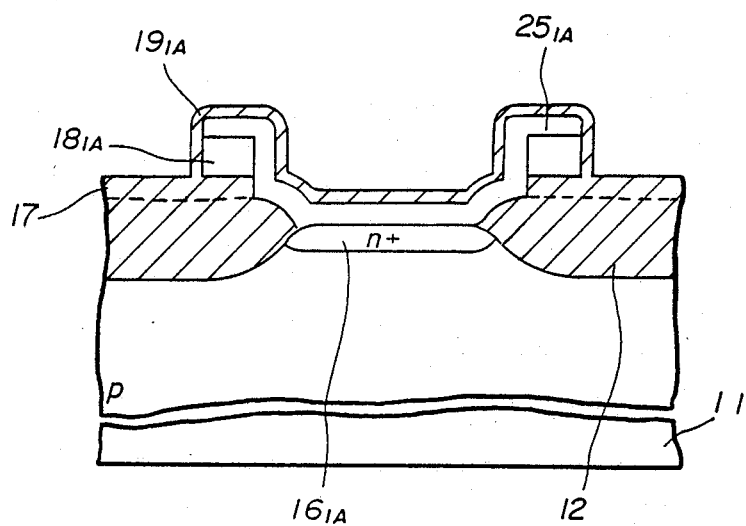

Then, as shown in FIGS. 8 and 14, dielectric films $19_{1A}$ and $19_{1B}$ are formed on the upper surface of the respective second conductive films $25_{1A}$ and $25_{1B}$, and side surfaces of the first patterned conductive film $18_A$ and $18_{1B}$ by thermal oxidation in which the silicon substrate 11 is placed in a wet atmosphere.

Figure 15:
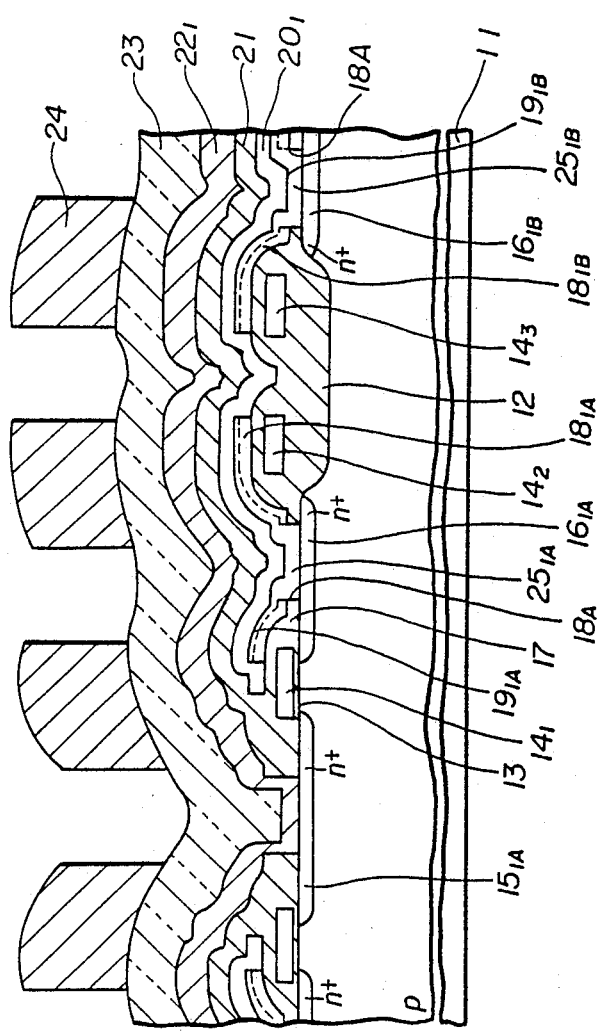
FIG. 15 is a cross sectional view taken along the line I—I shown in FIG. 1 for explaining the last manufacturing step of the first embodiment.

Thereafter, as shown in FIG. 15, the opposed electrode $20_1$, which is the other electrode of the memory cell capacitor called a cell plate, is formed by depositing and then patterning a polysilicon film. It is preferable to provide the opposed electrode $20_1$ with n+-type conductivity. Finally, by the conventional techniques, as shown in FIG. 15, formed are the interlayer insulation film 21, bit lines $22_1$ and $22_2$, the passivation film 23 and the word lines 24.

Figure 16:
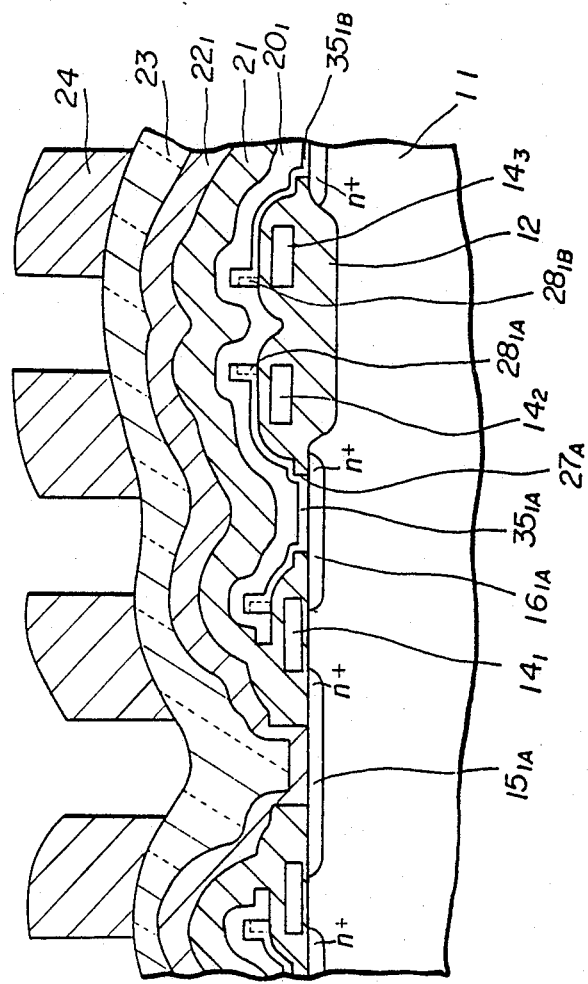
FIG. 16 is a cross sectional view of another preferred embodiment of the present invention.

A description is given of a second preferred embodiment of the present invention with reference to FIG. 16. In FIG. 16, those parts which are the same as those in the previous figures are indicated by the same reference numerals. The embodiment of FIG. 16 has an essential feature in which a first patterned conductive film $28_{1A}$ is formed above the gate electrodes $14_1$ and $14_2$ in the Y direction, and a second patterned conductive film $35_{1A}$ is formed so as to overlie the first patterned conductive film $28_{1A}$ and the interlayer insulation film 17.

Figure 19:
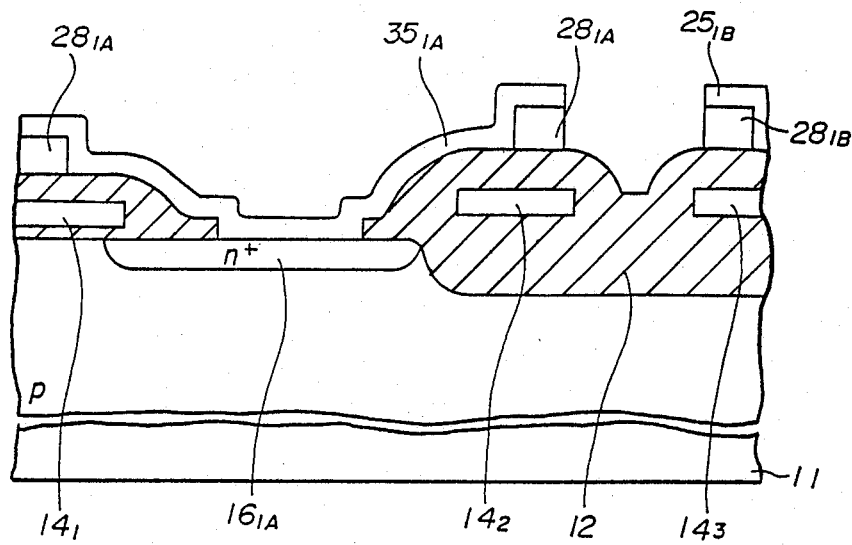
Figure 20:
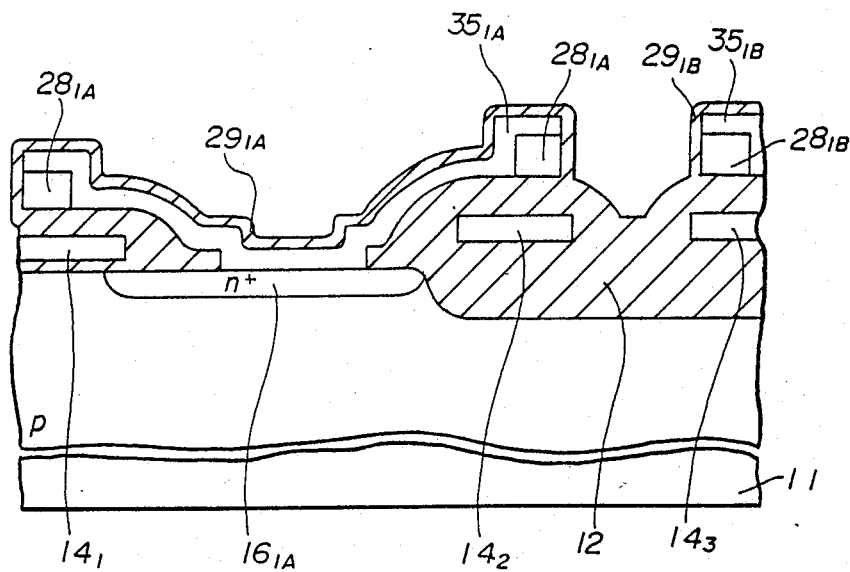
Figure 21:
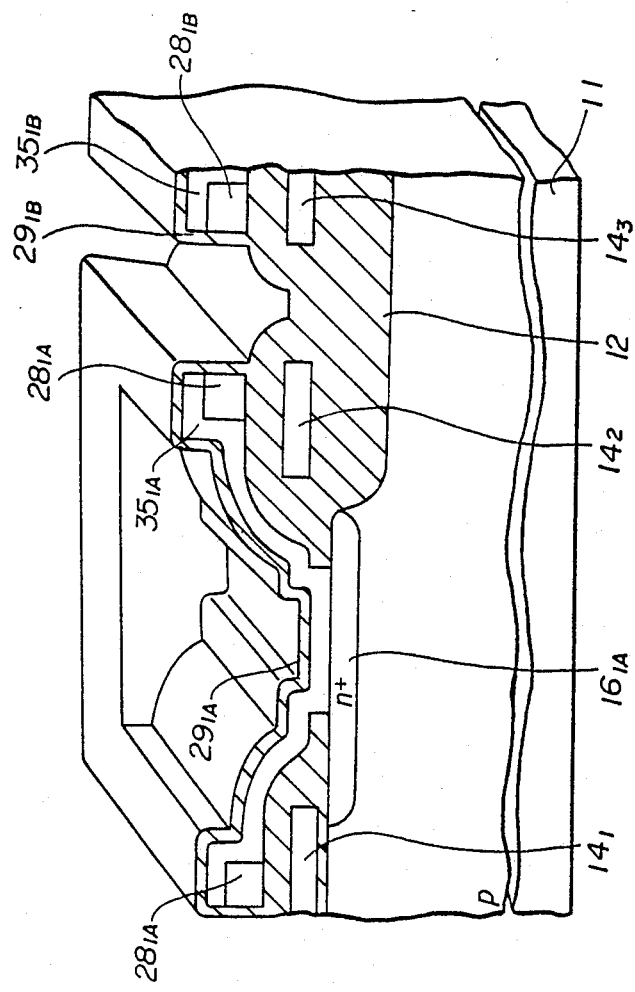
FIG. 21 is a perspective view having the cross section of FIG. 18.

A description is given of the second preferred embodiment of FIG. 16 with reference to FIGS. 17 through 21 which are cross sectional views observed at different production steps, and FIG. 21. In FIGS. 17 through 21, those parts which are the same as parts in the previous figures are given the same reference numerals.

As described previously, in the first embodiment, the same mask film is used for forming the contact window 18A in the polysilicon film $18_{1A}$ and then forming the contact window 18A in the the interlayer insulation film 17 and the gate insulation film 13. On the other hand, in the second preferred embodiment, a mask film used for forming a window in the polysilicon film 18 is different from a mask film used for forming a window in the interlayer insulation film 17 and the gate insulation film 13.

The production steps until the polysilicon film 18 is formed, are the same as those in the second embodiment. Therefore, a description is given of a sequence of steps subsequent to the above steps.

Figure 17:
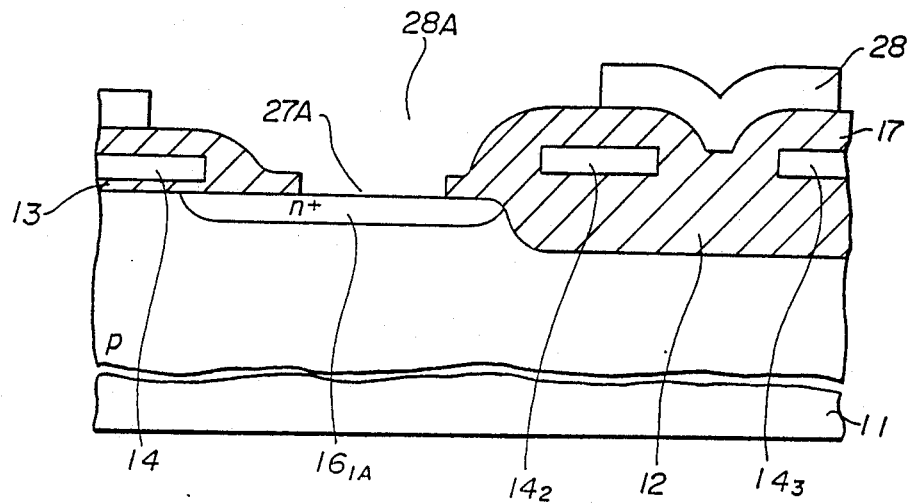
FIGS. 17 through 20 are cross sectional views taken along the line I—I shown in FIG. 1 at different production steps of another preferred embodiment of the present invention.

Referring to FIG. 17, the polysilicon film 18 deposited on the interlayer insulation film 17 shown in FIGS. 4 and 10, is selectively etched by the conventional photolithography technology so as to form a window 28A with respect to the storage electrode of the memory cell capacitor. Hereinafter, the polysilicon film 18 in which the window 28A is formed, is indicated by a reference numeral 28 to make clear a difference between the first and second embodiment. In the above-mentioned step, it is noted that the size of the window 28A is greater than that of the window 18A associated with the first embodiment described previously so that the window 28A extends above the gate electrodes $14_1$ and $14_2$. With the formation of the window 28A, it becomes possible to increase recesses and convexes on the surface portion of the storage electrode and to thereby increase the total surface area of the storage electrode, compared with the first embodiment.

After removing the mask film used for forming the window 28A in its entirety, another mask film is deposited. Then, the interlayer insulation film 17 and the gate insulation film 13 are selectively etched so as to form a window 27A through which a surface portion of the drain region $16_{1A}$ is exposed. In this case, it is preferable to define edges of the exposed surface portion of the drain region $16_{1A}$ which extend in the X direction by edges of the field insulation film 17 extending in the X direction, as in the case of the first embodiment.

Figure 18:
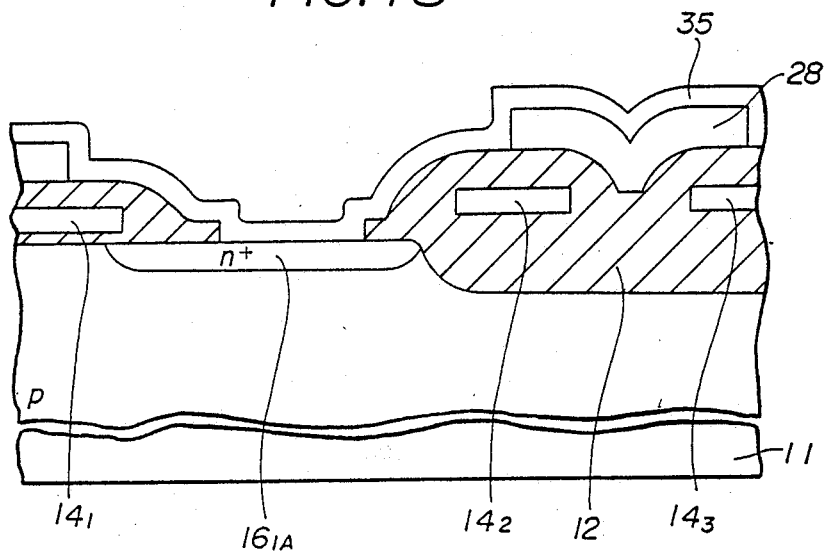

Thereafter, as shown in FIG. 18, a polysilicon film 35 is grown to a thickness of approximately 0.1 [μm] by chemical vapor deposition. Subsequently, n+-type impurity ions such as phosphorus (P) ions are implanted into the polysilicon film 35. The polysilicon film 35 is used for forming the second patterned conductive film of the storage electrode. The polysilicon film 35 is in contact with the drain region $16_{1A}$ and the polysilicon film 28.

The polysilicon film 35 and the polysilicon film 28 of FIG. 19 are patterned by the conventional photolithography technology. Thereby, as shown in FIGS. 20 and 21, first patterned conductive films $28_{1A}$ and $28_{1B}$, and second patterned conductive films $35_{1A}$ and $35_{1B}$ are formed which construct storage electrodes.

Referring to FIG. 20, dielectric films $29_{1A}$ and $29_{1B}$ are formed so as to cover surfaces of the first and second patterned conductive films $25_{1A}$, $25_{1B}$ and $35_{1A}$, $35_{1B}$ by thermal oxidation in which the silicon substrate 11 is placed in a wet atmosphere. Production steps subsequent to the step for formation of the dielectric films $29_{1A}$ and $29_{1B}$ are the same as those described previously.

With the layer structure of the second embodiment, an approximately 30% increase in capacitance of the memory cell capacitor is obtainable.

The present invention is not limited to the embodiments, and variations and modifications may be made without departing from the scope of the present invention.

What is claimed is:

1. A layer structure of a memory cell for a dynamic random access memory device comprising:
a semiconductor substrate;

an insulation film formed on the semiconductor substrate having a first window through which a surface of the semiconductor substrate is partially exposed;

a first conductive film formed on the insulation film so as to surround the contact window and form a second window above the first window;

a second conductive film formed so as to be in contact with the first conductive film, and the semiconductor substrate through the first and second windows, the first and second conductive films constructing a storage electrode of a memory cell capacitor, the first conductive film being thicker than the second conductive film;

a dielectric film formed so as to cover the storage electrode; and a third conductive film formed so as to cover the dielectric film.

2. A layer structure of a memory cell for a dynamic random access memory device as claimed in claim 1, wherein the first conductive film and the second conductive film comprise polysilicon.

3. A layer structure of a memory cell for a dynamic random access memory device as claimed in claim 1, wherein the layer structure further comprises a field insulation film formed in the semiconductor substrate, and wherein the semiconductor substrate has an impurity diffusion region above which the first and second windows are formed, and wherein edges of the exposed surface portion of the impurity diffusion region which extend in a predetermined direction are defined by edges of the field insulation film which extend in the same direction.

4. A layer structure of a memory cell for a dynamic random access memory device comprising:

a semiconductor substrate;

an insulation film formed on the semiconductor substrate having a first window through which a surface of the semiconductor substrate is partially exposed;

a first conductive film formed on the insulation film so as to surround the contact window and form a second window above the first window, the first window formed in the insulation film having a width which is substantially the same as a width of the second window formed in the first conductive film;

a second conductive film formed so as to be in contact with the first conductive film, and the semiconductor substrate through the first and second windows, the first and second conductive films constructing a storage electrode of a memory cell capacitor;

a dielectric film formed so as to cover the storage electrode; and a third conductive film formed so as to cover the dielectric film.

5. A layer structure of a memory cell for a dynamic random access memory device comprising:

a semiconductor substrate;

an insulation film formed on the semiconductor substrate having a first window through which a surface of the semiconductor substrate is partially exposed;

a first conductive film formed on the insulation film so as to surround the contact window and form a second window above the first window, the second window formed in the first conductive film having a width which is greater than a width of the first window formed in the insulation film, so that the insulation film is partially exposed through the second window;

a second conductive film formed so as to be in contact with the first conductive film, and the semiconductor substrate through the first and second windows, the first and second conductive films constructing a storage electrode of a memory cell capacitor;

a dielectric film formed so as to cover the storage electrode; and a third conductive film formed so as to cover the dielectric film.

6. A layer structure of a memory cell for a dynamic random access memory device comprising:

a semicondcutor substrate;

an insulation film formed on the semiconductor substrate having a first window through which a surface of the semiconductor substrate is partially exposed;

a first conductive film formed on the insulation film so as to surround the contact window and form a second window above the first window;

a second conductive film formed so as to be in contact with the first conductive film, and the semiconductor substrate through the first and second windows, the first and second conductive films constructing a storage electrode of a memory cell capacitor, the second conductive film being in contact with upper and inner side surfaces of the first conductive film, the inner side surface facing the corresponding first window;

a dielectric film formed so as to cover the storage electrode; and a third conductive film formed so as to cover the dielectric film.

7. A layer structure of a memory cell for a dynamic random access memory device as claimed in claim 4, wherein the first conductive film and the second conductive film comprise polysilicon.

8. A layer structure of a memory cell for a dynamic random access memory device as claimed in claim 5, wherein the first conductive film and the second conductive film comprise polysilicon.

9. A layer structure of a memory cell for a dynamic random access memory device as claimed in claim 6, wherein the first conductive film and the second conductive film comprise polysilicon.

10. A layer structure of a memory cell for a dynamic random access memory device as claimed in claim 4, wherein the layer structure further comprises a field insulation film formed in the semiconductor substrate, and wherein the semiconductor substrate has an impurity diffusion region above which the first and second windows are formed, and wherein edges of the exposed surface portion of the impurity diffusion region which extend in a predetermined direction are defined by edges of the field insulation film which extend in the same direction.

11. A layer structure of a memory cell for a dynamic random access memory device as claimed in claim 5, wherein the layer structure further comprises a field insulation film formed in the semiconductor substrate, and wherein the semiconductor substrate has an impurity diffusion region above which the first and second windows are formed, and wherein edges of the exposed surface portion of the impurity diffusion region which extend in a predetermined direction are defined by edges of the field insulation film which extend in the same direction.

12. A layer structure of a memory cell for a dynamic random access memory device as claimed in claim 6, wherein the layer structure further comprises a field insulation film formed in the semiconductor substrate, and wherein the semiconductor substrate has an impurity diffusion region above which the first and second windows are formed, and wherein edges of the exposed surface portion of the impurity diffusion region which extend in a predetermined direction are defined by edges of the field insulation film which extend in the same direction.

* * * * *

UNITED STATES PATENT AND TRADEMARK OFFICE
CERTIFICATE OF CORRECTION

PATENT NO. : 4,910,566
DATED : MARCH 20, 1990
INVENTOR(S) : TAIJI EMA

It is certified that error appears in the above-identified patent and that said Letters Patent is hereby corrected as shown below:

Col. 5, line 11, "$18_A$" should be --$18_{1A}$--;

line 16, "dificult" should be --difficult--;

line 32, "$18_A$" should be --$18_{1A}$--.

Signed and Sealed this

Thirtieth Day of April, 1991

*Attest:*

*Attesting Officer*

HARRY F. MANBECK, JR.

*Commissioner of Patents and Trademarks*